United States Patent
Liu et al.

(10) Patent No.: US 6,981,197 B2
(45) Date of Patent: Dec. 27, 2005

(54) ENHANCED INTERLEAVE TYPE ERROR CORRECTION METHOD AND APPARATUS

(75) Inventors: Bin Liu, Newark, CA (US); Edmun ChianSong Seng, Singapore (SG); UttHeng Kan, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 467 days.

(21) Appl. No.: 10/057,831

(22) Filed: Jan. 23, 2002

(65) Prior Publication Data

US 2002/0108087 A1 Aug. 8, 2002

Related U.S. Application Data

(60) Provisional application No. 60/263,625, filed on Jan. 23, 2001.

(51) Int. Cl.[7] ............................................. G11C 29/00
(52) U.S. Cl. ..................................................... 714/765
(58) Field of Search ............................. 714/765, 763, 714/769, 755, 784, 704, 752, 746

(56) References Cited

U.S. PATENT DOCUMENTS

| | | | |
|---|---|---|---|
| 5,691,993 A | 11/1997 | Fredrickson | |
| 5,809,042 A | 9/1998 | Nakamura et al. | |
| 6,009,550 A | 12/1999 | Gosula et al. | |
| 6,198,582 B1 | 3/2001 | Tsang et al. | |
| 6,202,178 B1 | 3/2001 | Spruyt | |
| 6,240,538 B1 * | 5/2001 | Dent et al. | 714/762 |
| 6,557,126 B1 * | 4/2003 | Kelly | 714/708 |
| 6,606,727 B1 * | 8/2003 | Yang et al. | 714/774 |

OTHER PUBLICATIONS

Yi et al., Interleaving and decoding scheme for a product code for a mobile data communication, Feb. 1997, IEEE Trans. on Comm., vol. 45, No. 2, p. 144-147.*

* cited by examiner

*Primary Examiner*—Shelly Chase
(74) *Attorney, Agent, or Firm*—Kirk A Cesari

(57) ABSTRACT

An enhanced interleave type error correction method is provided in which decoding of an enhanced interleave block is done. Subsequently the decoding may be done by decoding the estimated codewords multiple times using a single error correction code. In addition, a decoder and a digital communication system for implementing the enhanced interleave type error correction method are provided.

23 Claims, 5 Drawing Sheets

ENHANCED INTERLEAVE TYPE ERROR CORRECTION METHOD AND APPARATUS

CROSS REFERENCE TO RELATED APPLICATIONS

This application claims the benefit of U.S. Provisional Application No. 60/263,625, filed Jan. 23, 2001.

FIELD OF THE INVENTION

The present invention relates generally to digital communication systems. More particularly, the present invention relates to digital communication systems that use interleaved error correction code to protect data as it passes through a noisy communication channel.

BACKGROUND OF THE INVENTION

Digital communication systems are designed to transmit user data in some digitized form from a source to a destination The means coupling the source and destination can be a simple conducting wire, a global satellite system or a data storage system, such as a magnetic disk drive or an optical compact disk. The coupling means is often generalized as a channel between the source and destination.

All channels occasionally introduce noise and distortion into the signals they carry. The noise and the distortion change the transmitted signal and thus can create errors at the output. To protect the information in the transmitted signals as they pass through the channel, error correction systems have been developed that add additional information to the digital signal to be transmitted so that the original signal may be recovered even if the channel introduces errors.

An error correction system consists of an encoder and a decoder, both based on an error correction code (ECC). The encoder, used at the information source, computes a certain amount of parity check symbols from the user data to be transmitted or stored. The encoding is done by applying an encoding rule to the user data. Then, the user data and the parity check symbols, together known as codewords, are all transmitted or stored through the channel and may be corrupted by noises and distortions. At the destination, a detector is used to estimate the codewords transmitted or stored through the channel. The decoder at the destination takes in the estimations of the codewords and attempts to recover the original user data according to the encoding rule.

Because of the noises and distortions in the channel, the detector occasionally makes incorrect estimations. Consequently, the input to the decoder has errors. Sometimes the detector is not able to make a clear estimation from its input. In this case, the detector can flag some positions as erasures in the estimated codeword.

The error correction capability of a particular ECC is determined by its minimum Hamming distance, usually denoted as d. For such a code, there exist decoding algorithms that can correct t errors and recover s erasures as long as $d>2t+s$. In order to correct errors, the decoder tries to figure out whether there is any errors in the estimation and if there is, determine the position and the value of the errors and correct them. To recover erasures, the decoder makes decisions on erasures at known positions based on the code structure. Sometimes the decoder can not find a valid codeword, subject to the encoding rule, because of excessive errors or erasures in its input. In this case, the decoder may declare a failure in decoding.

In many digital communication systems, the data is processed in blocks independent of each other rather than individual symbols. For example, in some communication networks, data is transmitted and received in packets. In data storage devices, data is stored or retrieved in sectors. For the same amount of redundancy, maximum ECC protection of such blocks of data can be achieved by encoding every block of data into one single codeword. However, the encoder and decoder for such codes are usually too complicated to implement because the code required is too long. Thus, several shorter codewords are used to encode the whole block. In channels where burst error is a significant source of error, interleaving is used to spread a single long burst error to multiple codewords so that the error correction capability of several codewords can be combined to combat burst errors.

An example of an interleaving error correction system is found in the system used in storing and retrieving data from some magnetic storage devices. It is very important for the error correction system in these devices to be able to recover data suffering from long burst errors, which may result from defects in the storage media.

In a typical situation, user data is stored and retrieved in sectors. Each sector has 512 bytes of user data. The ECC of choice is a Reed-Solomon code over finite field $2^8$, whose symbol happens to be an 8-bit byte. The maximum length of a codeword of this code is 255 bytes, including the parity check symbols. Therefore, at least three codewords are needed to protect one sector. If three codewords are used, there are 171 bytes of user symbols in each codeword. By appending 4 parity check bytes to each 171-byte group, a code with minimum Hamming distance of 5 can be constructed. Then, storing, one after the other, a corresponding byte from each codeword and doing so repeatedly until all the bytes have been transmitted. Thus, the complete set of user bytes and ECC bytes for any one codeword can be found by sampling every third byte of the interleaved block. This is often referred to as a three-way bytewise interleave. The series of interleaved codewords is transmitted through the channel where it is occasionally corrupted by burst errors. The burst errors usually affect two or more consecutive bits and, because of the interleaving, corrupt two or more codewords.

Interleaving reduces the effects of burst errors on the ECC encoded signal. Burst errors are short duration error events affecting one or more consecutive symbols. By ensuring that consecutive words in the ECC encoded signal are not from the same codeword, interleaving reduces the chance that a burst error will affect more than one symbol in a codeword. If ECC can typically only correct two user bytes per codeword, interleaving will reduce the chances that a burst error will exceed the maximum number of symbols that can be corrected.

After being retrieved from the channel, the detector decodes the interleaved transmitted sequences into estimations of the ECC encoded signal. If a single block suffers from one very long burst error or more than one burst, the ECC decoder may not be able to correct the corrupted data because more than the maximum number of symbols of ECC encoded data will be corrupted in a single ECC codeword. In general, the single burst error correction capability is limited to $L \times t_0$ symbols, where L is the number of codewords in the interleaved block and $t_0$ is the random error correction capability of an individual codeword. The random error correction capability of an individual codeword can be determined by the particular ECC employed and the number of parity check blocks added to that codeword. It is well known in the art that decoders exist for typical ECCs that can be used to simultaneously correct errors at unknown positions and recovery erasures at known positions.

In some prior art systems, the number of parity check symbols to be added to each codeword is the same. When the interleaved block is decoded, if the decoder fails to decode any one of the codewords, the attempt to decode the whole block is considered a failure.

In other prior art systems, there is a first number of parity check blocks added to a selected codeword and there is a second number of parity check blocks that are added to the remaining codewords. In the latter prior art, a dual decoder system is implemented having two decoders with differing error correction codes, wherein each of the codes has a different error correction capability. The first decoder has a greater single burst error correction capability than the second decoder. During the encoding routine, parity check symbols are added to each codeword, but one codeword is selected from the number of codewords and more parity check symbol are added to the selected codeword. Thus, the selected codeword has a greater error correction capability than the other codewords. In relation, the first decoder allows correction of the errors in the selected codeword. When decoding the selected codeword and a correctable error is detected, the dual-decoder system assumes that errors exist in adjacent positions of the other codewords.

The adjacent positions to the correctable error positions of the first decoded codeword are identified as erasures in the other codewords and then used in the decoding of the subsequent codewords. This allows an increment in the burst error correction capability of the whole block. There are some major weaknesses of this prior art. First, hardware ECC decoders are very sophisticated circuits, so dual decoders at the destination incurs extra complexity in hardware and development, especially for high data rate applications. Thus, the requirement of using two different decoders to decode an interleaved codeword is not desirable. A very important fact is that, in many systems, the encoding method, or equivalently, the signal format transmitted through the channel or the data format stored in the media, is already fixed because of the necessity of supporting existing legacy systems or open standards. Most of these systems use only one code and interleave. This prior art cannot be applied because it requires a change in the encoding scheme.

Therefore, there is a need in the technology to provide a more efficient method to encode and decode a data signal in a communication system that can be used with existing systems and standards.

The present invention provides a solution to this and other problems, and offers other advantages over the prior art.

SUMMARY OF THE INVENTION

The present invention relates to digital communication systems that have an encoder employing an interleaving method and decoders which solve the above-mentioned problem.

In accordance with one embodiment of the invention, a decoding method is provided in which decoding of an interleaved block containing a number, L, of interleaved codewords, each of which is encoded following one encoding rule. The interleaving being performed in such a manner that any L consecutive symbols consist of exactly one symbol from each of the L codewords. In a preferred embodiment, the decoder may process the selected set of codewords twice, after the first pass through the selected codewords the decoder will set pointers to mark the position of burst errors. Additionally, the invention also can be implemented as a digital communication system.

The present invention also can be implemented as a decoder containing an error correction circuit to perform a decoding method.

These and various other features as well as advantages which characterize the present invention will be apparent upon reading of the following detailed description and review of the associated drawings.

DETAILED DESCRIPTION

Figure 1:
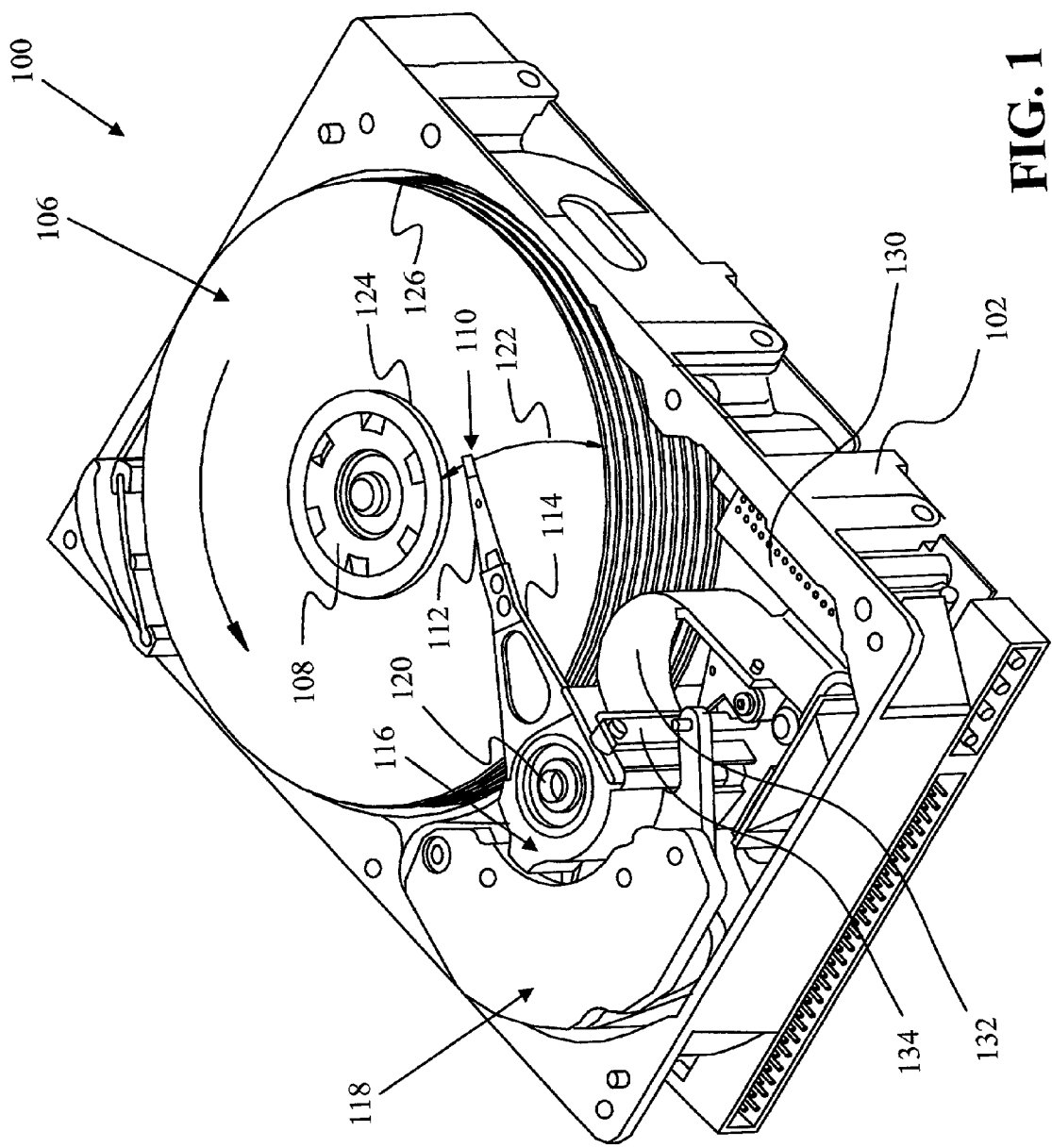
FIG. 1 is a plan view of a disc drive incorporating a preferred embodiment of the present invention showing the primary internal components.

A disc drive 100 constructed in accordance with a preferred embodiment of the present invention is shown in FIG. 1. The disc drive 100 includes a housing with a base 102 to which various components of the disc drive 100 are mounted. A top cover (not shown) cooperates with the base 102 to form an internal, sealed environment for the disc drive in a conventional manner. The components include one or more discs 106 which are mounted on a spindle motor (not shown) by a disc clamp 108. Information is written to and read from tracks on the discs 106 through the use of an actuator assembly 116. The actuator assembly 116 includes a plurality of actuator arms 114 which extend towards the discs 106, with one or more flexures 116 extending from each of the actuator arms 114. Mounted at the distal end of each of the flexures 116 is a head 118 which includes an air bearing slider 110 enabling the head 110 to fly in close proximity above the corresponding surface of the associated disc 106. In the example shown in FIG. 1, sliders 110 are supported by suspensions 112 which are in turn attached to track accessing arms 114 of actuator 116. The actuator shown in FIG. 1 is of the type known as a rotary molting coil actuator and includes a voice coil motor (VCM), shown generally at 118. Voice coil motor 118 rotates actuator 116 with its attached heads 110 about a pivot shaft 120 to position heads 110 over a desired data track along an actuate path 122 between a disc inner diameter 124 and a disc outer diameter 126.

Figure 2:
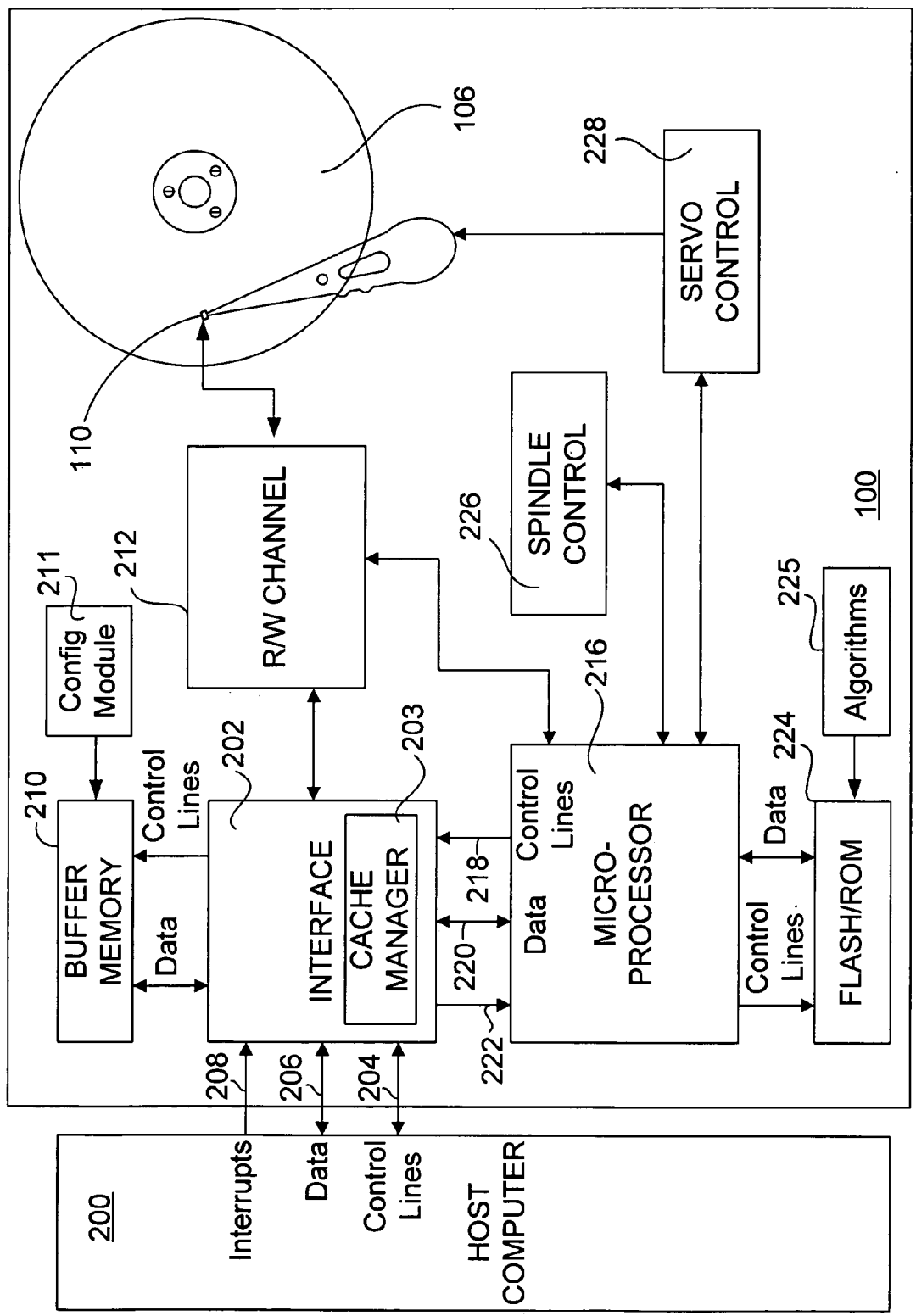
FIG. 2 is a functional block diagram of the disc drive of FIG. 1 in accordance with a preferred embodiment of the present invention.

A flex assembly 132 provides the requisite electrical connection paths for the actuator assembly 116 while allowing pivotal movement of the actuator assembly 110 during operation. The flex assembly 132 includes a printed circuit board 134 to which head wires (not shown) are connected; the head wires being routed along the track accessing arms 114 and the sliders 112 to the heads 110. The printed circuit board (not shown) typically includes circuitry for controlling the write currents applied to the heads 110 during a write operation and a preamplifier for amplifying read signals generated by the heads 110 during a read operation. The flex assembly terminates at a flex bracket 130 for communication through the base 102 to a disc drive printed circuit board (not shown) mounted to the bottom side of the disc drive 100. Referring now to FIG. 2, shown therein is a functional block diagram of the disc drive 100 of FIG. 1, generally showing the main functional circuits which are typically resident on a disc drive printed circuit board and which are used to control the operation of the disc drive 100. As shown in FIG. 2, the host 200 is operably connected to an interface application specific integrated circuit (interface) 202 via control lines 204, data lines 206, and interrupt lines 208. The interface 202 typically includes an associated buffer 210 which facilitates high speed data transfer between the host 200 and the disc drive 100. The buffer 210 may be referred to as cache memory. Data to be written to the disc drive 100 are passed from the host to the interface 202 and then to a read/write channel 212, which encodes and serializes the data. A cache manager 203 is included to manage the cache memory of the buffer 210 in response to commands received from the host 200. The cache manager 203 is operable to dynamically select a cache management algorithm corresponding to a pattern of access exhibited by the host 200. Details of the cache manager 203 are discussed below.

The read/write channel 212 also provides the requisite write current signals to the heads 110. To retrieve data that has been previously stored by the disc drive 100, read signals are generated by the heads 110 and provided to the read/write channel 212, which processes and outputs the retrieved data to the interface 202 for subsequent transfer to the host 200.

As also shown in FIG. 2, a microprocessor 216 is operably connected to the interface 202 via control lines 218, data lines 220, and interrupt lines 222. The microprocessor 216 provides top level communication and control for the disc drive 100 in conjunction with programming for the microprocessor 216 which is typically stored in a microprocessor memory (MEM) 224. The MEM 224 can include random access memory (RAM), read only memory (ROM) and other sources of resident memory for the microprocessor 216. Additionally, the microprocessor 216 provides control signals for spindle control 226, and servo control 228.

Figure 3:
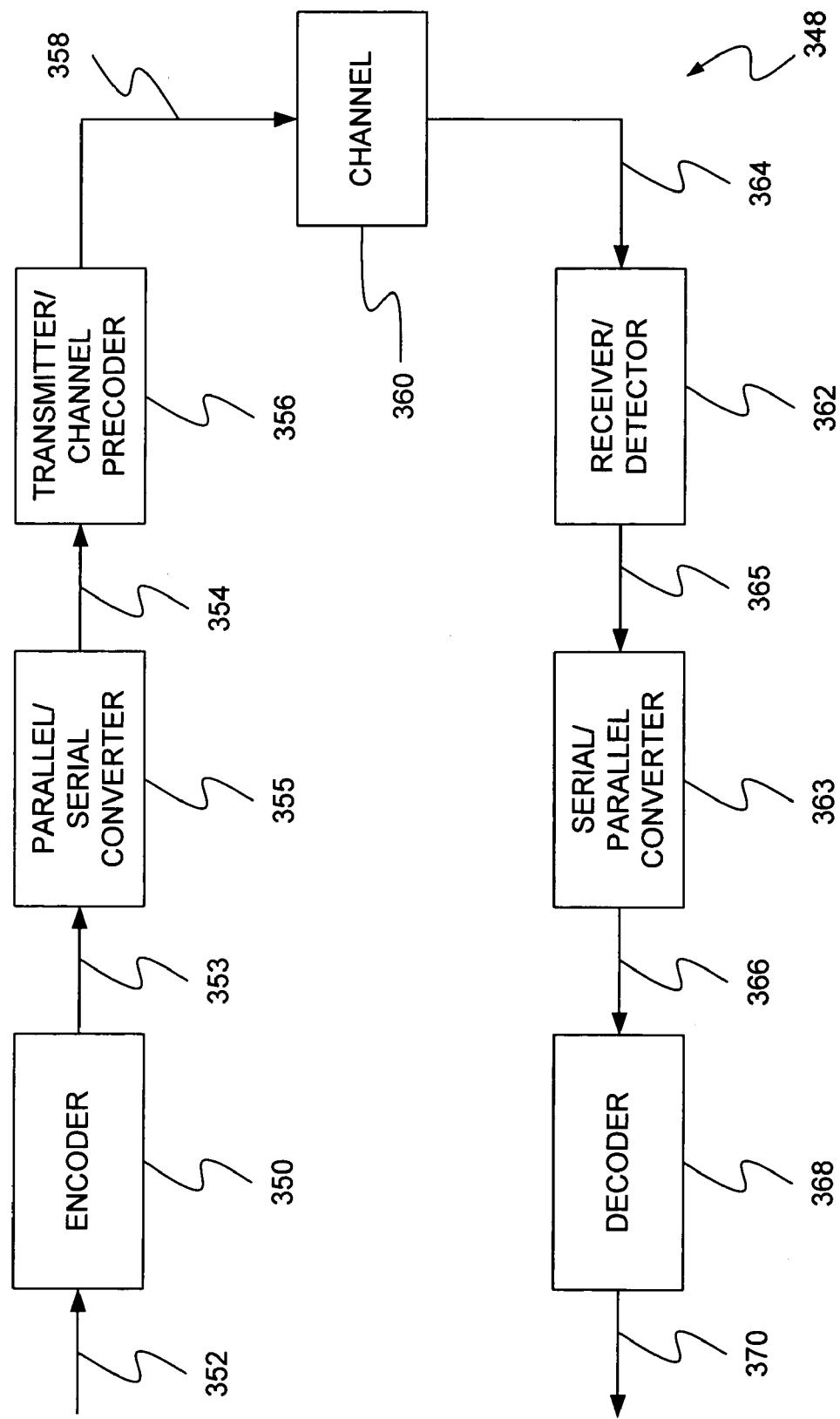
FIG. 3 is a block diagram of a read channel.

FIG. 3 is a block diagram of a generalized digital communication system 348 used with the present invention. Encoder 350 receives data samples 352 and produces codewords 353. Codewords 353 are provided to parallel-to-serial converter 355 in a parallel manner such that all of the bits of a respective codeword are provided to converter 355 at the same time. Parallel-to-serial converter 355 converts each parallel codeword 353 into a serial representation and concatenates the serial representations to produce a sequence of bits 354.

Transmitter/channel precoder 356 receives the sequence of bits 354 and conditions the sequence so that it is optimized for the type of detector used to recover the signal from the channel. Transmitter/channel precoder 356 produces write signal 358, which is provided to channel 360.

Channel 360 conveys the encoded information from transmitter/precoder 356 to receiver/detector 362 as a read signal 364. Receiver/detector 362 amplifies and filters read signal 364 and recovers an encoded signal from the read signal using one of several known detection methods. For instance, receiver/detector 362 may use a Partial Response Maximum Likelihood (PRML), Decision Feedback Equalization (DFE), Fixed Delay Tree Search with Decision Feedback (FDTS/DF) or Reduced State Sequence detection (RSSE).

After amplifying and detecting the signal from channel 360, receiver/detector 362 produces a recovered sequence of bits 365, which are provided to serial-to-parallel converter 363. Sequence of bits 365 is in a serial format at the input to serial-to-parallel converter 363. Serial-to-parallel converter 363 groups the bits into estimated codewords and converts the codewords from a serial format to a parallel format. Serial-to-parallel converter 363 then outputs the codewords 366 in a parallel format to decoder 368. Decoder 368 converts the estimated codewords 366 into recovered data stream 370. The decoder can also flag a failure in recovering the data if it cannot decode the estimated codewords.

Figure 4:
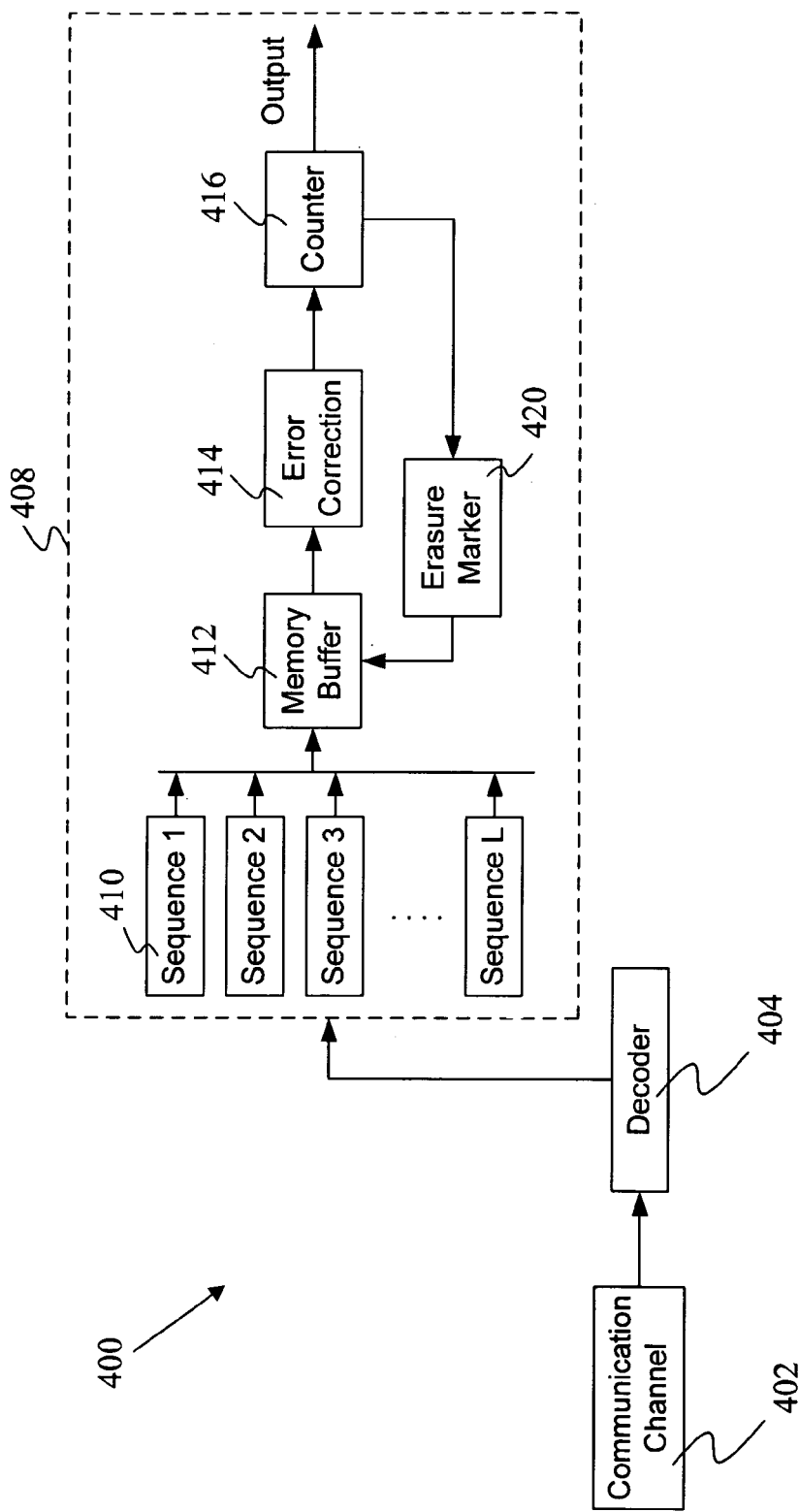
FIG. 4 is a block diagram of a preferred embodiment decoder which can be used in the system shown in FIG. 3.

FIG. 4 shows a communication system 400 constructed in accordance with an embodiment of the present invention. Data transmission through a communication channel 402, representative of a system like one depicted in FIG.3, may generate random errors and burst errors. In one embodiment of the present invention, the communication channel 402 may use a linear block code C(n, k, d), where n is the length of the code, k is the dimension of the code, and d is the minimum Hamming distance. The interleaving procedure takes L codewords from the linear block code C(n, k, d). These values are in terms of symbols which could consist of a simple binary bit or multiple bits. The symbols are then transmitted through the communication channel. In some embodiments of the present invention, a transmission index can be assigned to each transmitted symbol according to the order in which the symbols are transmitted through the channel. With all the indices starting from 1, the mth symbol in the jth interleave has the transmission index $(m-1) \cdot L+j$.

In the preferred embodiment a number, L, of codewords of a linear block code are transmitted through the communication channel in an interleaved manner such that any L consecutive symbols consist of exactly one symbol from each of the L codewords.

After receiving the codewords from the communication channel, Decoder 404 is enabled to restore the sequences of symbols from a reconstructed interleave block.

One embodiment of the decoder 404 is shown as decoder 408. The de-interleaved estimated codewords 410 are passed to a memory buffer 412 where they are stored. Error correction system 414 processes each estimated codeword 410 once. The output of the error correction system 414 is input to counter 416. Counter 416 checks the number of uncorrectable estimated codewords in the block of estimated codewords 410. Counter 416 may be embedded in the decoder. Syndrome may be used for error detection. If the number of uncorrectable estimated codewords is zero, the decoder has corrected all the errors. The information symbols are then extracted from each codeword and handed to the host (not shown).

If all of the estimated codewords are uncorrectable then decoding of the de-interleaved block fails. The whole de-interleaved block cannot be recovered and the data host (not shown) is notified.

If there are more than zero uncorrectable estimated codewords, but less than a maximum threshold, there are both correctable and uncorrectable estimated codewords. In this instance, the correctable estimated codewords are sent to the erasure marker 420 that extracts the corrected error positions from the correctable estimated codewords. The erasure marker 420 marks the erasure positions (not shown) in the uncorrectable estimated codewords in memory buffer 412. The erasure positions (not shown) are marked by first building an ordered error position list, sorted using the transmission index of the erroneous symbol. Then, for each interval $J_l$ between two consecutive error positions $e_l$ and $e_{l+1}$, if $J_l > M$, where $M \leq L$, L being the maximum threshold, the next error position interval is examined. For error interval $J_l \leq M$, if the symbols whose transmission indices are within the range $e_l - L+1, e_l - L+2, \ldots, e_{l+1} - L+1$ and the symbols belong to the uncorrectable estimated codewords, they are marked as erasures.

After all of the possible erasures are marked, error correction system 414 performs the error correction a second time that facilitates recovery of the erasures and correction of errors. After the second round of decoding, the number of uncorrectable interleaved sequences are counted again by counter 416. If the number of uncorrectable estimated codewords equals zero, the decoding of the de-interleaved block is successful and the information symbols are extracted from each codeword and handed to the data host (not shown). If the number of uncorrectable estimated codewords is greater than zero, the error patterns are beyond the error correction capability of the proposed decoding procedure. Thus, the decoding of the de-interleaved block fails and the data host (not shown) is notified.

Figure 5:
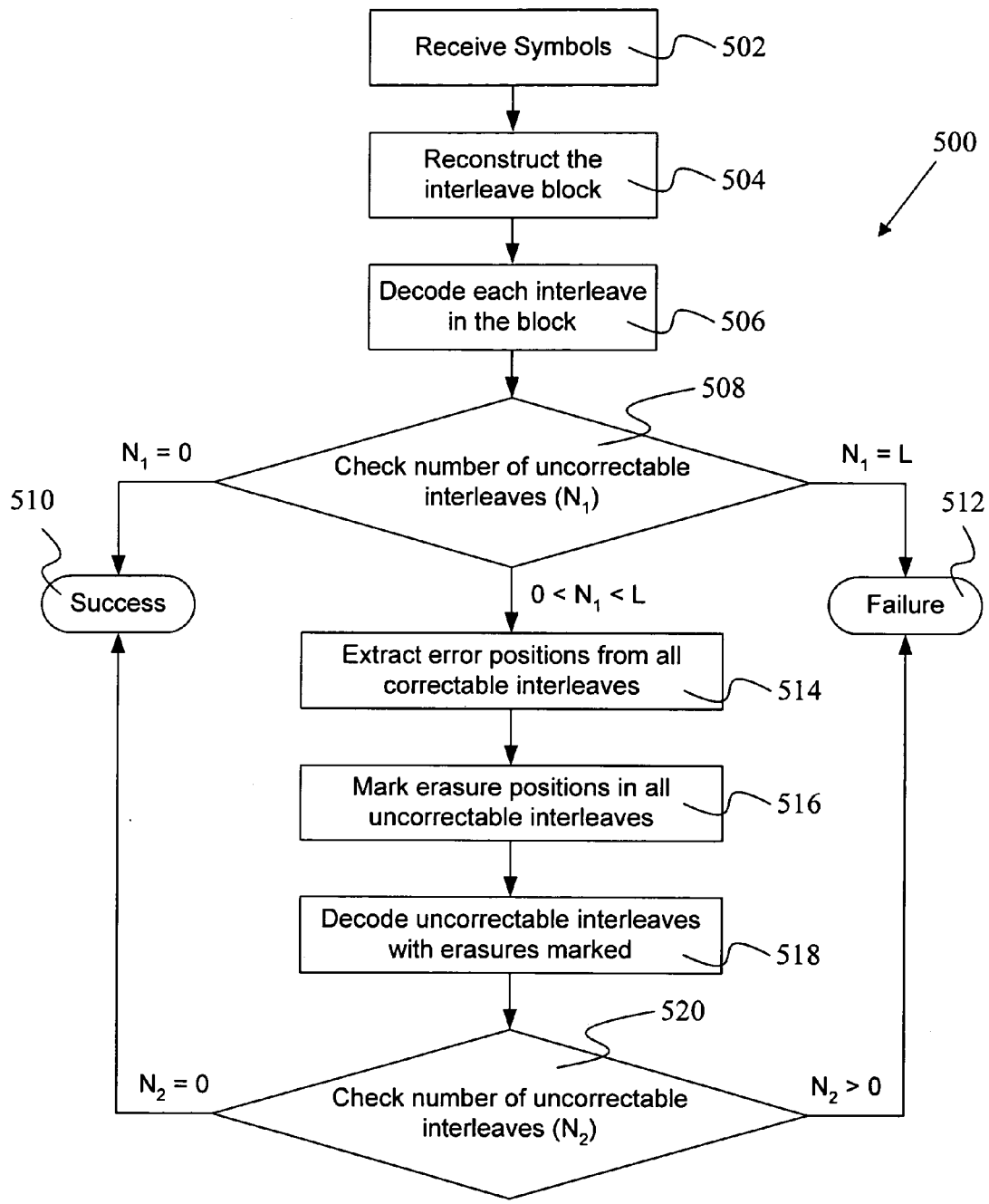
FIG. 5 is a flowchart detailing a preferred embodiment decoding method.

The present invention can be summarized in reference to FIG. 5 which illustrates a flowchart of a method of correcting errors in accordance with a preferred embodiment of the present invention. The illustrated method is usually represented as an algorithm inside a decoder, such as decoder 368 or other similar process means. First, in step 502, data is received from the communication channel 402. Then, in step 504, the received signal is reconstructed to form a de-interleaved block of data. This is done by rearranging the received symbols such that each individual sequence is an estimation of the corresponding estimated codewords that were encoded.

Next, in step 506, the de-interleaved block is decoded This decoding is performed without any information of burst error positions. When an estimated codeword is found to have been corrupted by a correctable error pattern, the error pattern is corrected and the positions of the erroneous symbols are saved.

After the error-correction algorithm has been applied, the algorithm checks the number of uncorrectable estimated codewords, represented as step 508. If the number of uncorrectable estimated codewords equals zero, the decoding of the interleaved block was successful and then the method proceeds with step 510, where the information symbols are extracted from each codeword and handed to the data host. The decoding procedure is then complete.

If the number of uncorrectable estimated codewords, in step 508, are all uncorrectable, the decoding of the de-interleaved block has failed and the process moves to step 512. Usually, the whole de-interleaved block cannot be recovered and the data host is notified.

In step 508, if the number of uncorrectable estimated codewords is greater than zero but less than the total number of estimated codeword in the de-interleaved block, the process moves to step 514. Stated another way, the process proceeds to step 514 if $0<N<L$, where N is the number of uncorrectable estimated codewords and L is the total number of codewords in the interleaved block.

In step 514, the error positions from the correctable estimated codewords are extracted. Then the process proceeds to step 516 where the erasure positions in all the uncorrectable estimated codewords are marked according to their respective error positions obtained in step 514. The erasure positions are marked according to the following algorithm.

First, an ordered error position list is built. The ordered error position list may be sorted by using the transmission index of the erroneous symbol. For each interval $J_l$, between two consecutive error positions $e_l$ and $e_{l+1}$, if $J_l > M$, where $M \leq L$, then the next error position is examined. Otherwise, the symbols whose transmission indices are within the range $e_l - L+1, e_l - L+2, \ldots, e_{l+1} - L+1$ and which are in uncorrectable estimated codewords are marked as erasures.

After the algorithm has finished, the process proceeds to step 518, where each of the uncorrectable estimated codewords with erasures marked is decoded. Any well-known algorithm that enables the decoder to recover the erasures and correct errors simultaneously may be used.

Finally, the number of uncorrectable estimated codewords is checked after the second round of decoding, step 520. If the number of uncorrectable estimated codewords equals zero, the decoding of the de-interleaved block was successful and then the method proceeds with step 510, where the information symbols are extracted from each codeword and handed to the data host. The decoding procedure is then complete.

The above described decoding apparatus and method can enhance the single burst error correction capability to $L \cdot (t_0+1) - 1$ symbols, where L is the number of codewords in the interleaved block and $t_0$ is the random error correction capability of an individual codeword. This error correction capability can be achieved using any interleave type encoder which has a number, L, of codewords and the symbols of these codewords are interleaved in such a manner that any consecutive L symbols consists of exactly one symbol from each of the L codewords. Thus, the interleaver is not limited to only corresponding symbol locations from each codeword.

The enhancement of the single burst error correction capability to $L \cdot (t_0+1) - 1$ symbols is effective because of the erasure positions marked in the uncorrectable interleaves. A proof of the enhanced single burst error correction capability is given bellow.

There are a number, L, of codewords that are grouped in a block and interleaved for transmission. There is also an interval, I, between two consecutive errors $e_l$ and $e_{l+1}$. If $I = e_{l+1} - e_l \leq M$, then the symbols with transmission index $$e_l - L+1, e_l - L+2, \ldots, e_l - 1, e_l, e_l + 1, \ldots, e_{l+1}, e_{l+1} + 1, \ldots, e_{l+1} + L - 1$$

Are considered as part of a burst. The length of the suspected burst is thus $$B = (e_{l+1} + L - 1) - (e_l - L + 1) + 1 = e_{l+1} - e_l + 2L - 1 = I + 2L - 1,$$

Because $1 \leq I \leq M$, $2L \leq B \leq M + 2L - 1$. Since any consecutive L symbols in transmission must have exactly one symbol from each of the L codewords, a burst error of length 2L or more must have at least two symbols from each of the L codewords. Any uncorrectable interleave is then marked with at least two erasures.

An uncorrectable interleave has at least $t_0 + 1$ errors. With two erasures marked, the decoder can correct up to $[(d-3)/2]$ errors elsewhere, making the total error correction capability increased to $$[(d-3)/2] + 2 = [(d-1)/2 + 1] = t_0 + 1,$$

Where d is the minimum Hamming distance of the code. If the burst error is longer, more erasures will be marked because of the closeness of $e_{l+1}$ and $e_{l+2}$ and the decoder will still be able to recover the whole interleaved block, as long as the number of erasures marked is less than d.

A potential problem is that too many erasures being marked. This may happen when the block suffers from multiple short burst errors. Note that for a single burst, we have $2L \leq B \leq 3L - 1$ if $M = L$. This means that up to three symbols may be marked as erasures for a pair of error positions in correctable interleaves. If the block suffered from $t_0$ short burst errors, too many erasures could have been marked. In this case, we can un-mark some of them to keep the total number of erasures in a single interleave to be no more than $2t_0$ or $d-1$ so that the decoder can still perform decoding.

One of the advantages of the decoding method 500 over other types of designs is the use of a single decoder to process codewords where the number of errors is greater than the standard error correction capability of the individual codewords.

Alternately characterized, a first contemplated embodiment of the invention includes receiving an interleaved block containing a number, L, of interleaved codewords, wherein the interleaving was done in such a manner that any L consecutive symbols consist of exactly one symbol from each of the L codewords, the interleaved codewords being made up of symbols; de-interleaving the interleaved block of symbols to obtain estimated codewords for the block of symbols 504, wherein errors may be present in the symbols; performing a first decoding of the estimated codewords by using a first error correction code 506; marking erasure positions in uncorrectable estimated codewords 516; and performing a second decoding 518 of the estimated codewords by using the first error correction code, where the second decoding is at least partially based on the erasure positions marked from correctable estimated codewords, Preferably, marking erasure positions also includes marking erasure positions according to error positions extracted 514 from correctable estimated codewords. Optionally, the method also includes performing a second decoding 518 during which only the uncorrectable estimated codewords are decoded according to the erasure positions marked 516 from correctable estimated codewords. Also, another embodiment may determine a number of uncorrectable estimated codewords, wherein the determining function is done after the first decoding 508 or after the second decoding 520. Another embodiment includes marking erasure positions 516 by sorting error positions, obtained in the first decoding, by the transmission index of erroneous symbols, and examining the intervals between each consecutive error position.

A second contemplated embodiment is a decoder 408 for use in a data communication system 348 wherein random and burst errors may be present in the transmitted information code including an erasure marker for marking erasure positions in data sequences 420, and an error correction circuit 414 for performing error correction on a de-interleaved block that was decoded from an interleaved block, where the interleaved block contained a number, L, of interleaved codewords, wherein the interleaving was done in such a manner that any L consecutive symbols consisted of exactly one symbol from each of the L codewords, operably coupled to the erasure marker, the error correction circuit 414 being designed to perform a first decoding of the estimated codewords and subsequently perform a second decoding of the estimated codewords where the second decoding uses the same error correction circuit 414 as the first decoding and is at least partially based on the erasure positions marked by the erasure marker 420. Preferably, the decoder 408 includes a method 416 for determining a number of uncorrectable estimated codewords.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the channel while maintaining substantially the same functionality without departing from the scope and spirit of the present invention. In addition, although the preferred embodiment described herein is directed to a read channel for a disc drive system, it will be appreciated by those skilled in the art that the teachings of the present invention can be applied to other systems, like communication systems or other storage systems, without departing from the scope and spirit of the present invention.

What is claimed is:

1. An interleave type decoding method, comprising steps of:
   receiving an interleaved block containing a number, L, of interleaved codewords, wherein the interleaving was done in such a manner that any L consecutive symbols consist of exactly one symbol from each of the L codewords, the interleaved codewords being made up of symbols;
   de-interleaving the interleaved block of symbols to obtain estimated codewords for the block of symbols, wherein errors may be present in the symbols;
   performing a first decoding of the estimated codewords by using a first error correction code;
   marking erasure positions in uncorrectable estimated codewords;
   performing a second decoding of the estimated codewords where the second decoding is at least partially based on the erasure positions marked from correctable estimated codewords; and
   whereby the first and second decoding enhances the error correction capability to a number, $L \cdot (t_0+1)-1$, of symbols, where L is the number of codewords in a de-interleaved block and $t_0$ is the random error correction capability of an individual codeword.

2. The method of claim 1 wherein marking erasure positions further comprises marking erasure positions according to error positions extracted from correctable estimated codewords.

3. The method of claim 1 wherein performing a second decoding further comprises decoding only the uncorrectable estimated codewords according to the erasure positions marked from correctable estimated codewords.

4. The method of claim 1 further comprising determining a number of uncorrectable estimated codewords, wherein the determining function is done after the second decoding.

5. The method of claim 1 further comprising determining a number of uncorrectable estimated codewords, wherein the determining function is done after the first decoding.

6. The method of claim 1, wherein an encoding procedure used to create the interleaved block comprises a transmission index that is assigned to each symbol according to the order in which the symbols will be transmitted trough a communication channel.

7. The method of claim 6, wherein marking erasure positions further comprises:
   sorting error positions, obtained in the first decoding, by the transmission index of erroneous symbols; and
   examining the intervals between each consecutive error position.

8. The method of claim 7, wherein the examining the intervals further comprises:
   determining an interval between consecutive error positions $e_i$ and $e_{i+1}$;
   comparing the interval to a predefined threshold which is not greater than L;
   marking as erasures the symbols that have a transmission index between $e_i-L+1$ and $e_{i+1}+L-1$, it the interval is less than the predefined threshold, where L represents the number of codewords in an interleave block.

9. The method of claim 8, wherein the predefined threshold is the same as L.

10. A decoder for use in a data communication system wherein errors may be present in the transmitted information code, comprising:
   (a) a marker for marking error positions in data sequences; and
   (b) an error correction circuit for performing error correction on de-interleaved codewords the error correction circuit being designed to perform a first decoding of a de-interleaved codeword and subsequently perform a second decoding of the de-interleaved codeword wherein the second decoding is at least partially based on marked error the positions.

11. The decoder of claim 10 wherein the marker further comprises circuitry for marking positions according to error positions extracted from correctable estimated codewords.

12. The decoder of claim 10 wherein the error correction circuitry further comprises circuitry for performing a second decoding only on the uncorrectable estimated codewords according to the error positions extracted from correctable estimated codewords.

13. The decoder of claim 10 wherein the error correction circuitry further comprises a counter for determining a number of uncorrectable estimated codewords.

14. The decoder of claim 10 wherein the error correction circuitry further comprises a counter for determining a number of uncorrectable estimated codewords after the second decoding.

15. The decoder of claim 10 wherein the error correction circuitry further comprises a counter for determining a number of uncorrectable estimated codewords after the first decoding.

16. The decoder of claim 10 wherein an error correction capability of the decoder is enhanced to a number, $L \cdot (t_0+1) -1$, of symbols, where L is the number of codewords in an interleaved block and $t_o$ is the random error correction capability of an individual codeword.

17. A disc drive comprising the decoder of claim 10 and further comprising:
   at least one disc for storing data;
   a transducer for reading and writing data from the disc;
   a communication channel, operatively coupled to the transducer for transmitting data, the communication channel comprising the decoder.

18. A data commununication system comprising
   (a) an encoder for producing an interleaved block containing a number, L, of interleaved codewords, wherein the interleaving was done in such a manner that any L consecutive symbols consist of exactly one symbol from each of the L codewords, the codewords containing symbols;
   (b) a communication channel, operatively coupled to the encoder, that may introduce errors into the transmitted sequences;
   (c) a decoder, operatively coupled to the communication channel, comprising:
      (i) an erasure marker for marking erasure positions in estimated codewords; and
      (ii) an error correction circuit for performing error correction on a de-interleaved block that was decoded from an interleaved block, where the interleaved block contained a number, L, of interleaved codewords, wherein the interleaving was done in such a manner that any L consecutive symbols consisted of exactly one symbol from each of the L codewords, operably coupled to the erasure marker, the error correction circuit being designed to perform a first decoding of the estimated codewords and subsequently perform a second decoding of the estimated codewords where the second decoding is at least partially based on the erasure positions marked by the erasure marker.

19. The data communication system of claim 18 wherein the erasure marker further comprises circuitry for marking erasure positions according to error positions extracted from correctable estimated codewords.

20. The data communication system of claim 19 wherein the error correction circuitry further comprises circuitry for performing a second decoding only on the uncorrectable estimated codewords according to the erasure positions extracted from correctable estimated codewords.

21. The data communication system of claim 18 wherein the error correction circuitry further comprises a counter for determining a number of uncorrectable estimated codewords.

22. The data communication system of claim 18 wherein the encoder further comprises a transmission index that is assigned to each symbol according to the order in which the symbols are transmitted through the channel.

23. The data communication system of claim 18 implemented in a communication channel of a storage device such as a disc drive or CD-ROM.

* * * * *